Sept. 6, 1966 J. C. IRVIN 3,271,636

GALLIUM ARSENIDE SEMICONDUCTOR DIODE AND METHOD

Filed May 13, 1963

INVENTOR
J. C. IRVIN
BY H. W. Lockhart
ATTORNEY

United States Patent Office 3,271,636
Patented Sept. 6, 1966

3,271,636
GALLIUM ARSENIDE SEMICONDUCTOR DIODE AND METHOD

John C. Irvin, Berkeley Heights, N.J., assignor to Bell Telephone Laboratories, Incorporated, New York, N.Y., a corporation of New York Filed May 13, 1963, Ser. No. 279,788
4 Claims. (Cl. 317—234)

Figure 1:
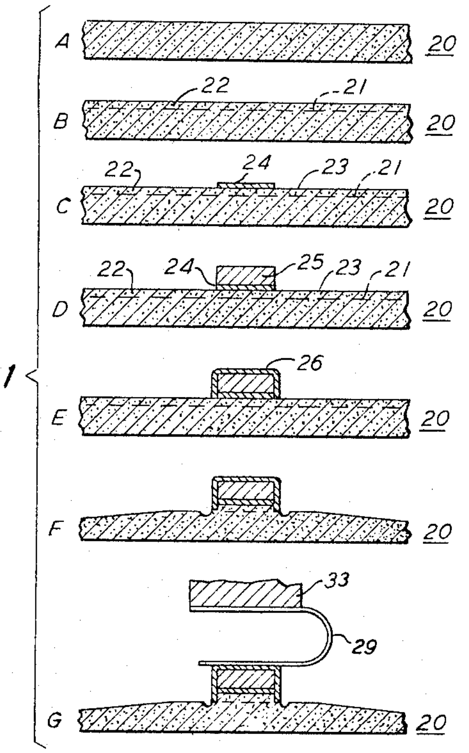

This invention relates to semiconductor diodes and, more particularly, to capacitance sensitive diodes of gallium arsenide which are generally termed varactor diodes. This application is a continuation-in-part of my application Serial No. 232,511, filed October 23, 1962.

The performance characteristics for gallium arsenide varactor diodes require a structure including a thin surface region, typically produced by shallow diffusion treatments resulting in pn junctions located from a few tenths of a few microns from the semiconductor surface or by metal film deposition to produce a surface barrier pn junction. Good low resistance contact must be made to this thin surface region with a structure which lends itself readily to external lead attachment. In addition, electrical requirements for the devices necessitate limiting the cross sectional area of the pn junction itself. With all these factors, it is necessary to balance the fabrication procedures in order to provide a satisfactory device at reasonable cost.

Thus one broad object of this invention is an improved gallium arsenide varactor diode. In particular, the invention provides a diode having reduced series resistance as well as one which offers simpler and more facile methods of fabrication.

In one aspect the device and method of its fabrication comprises a wafer of gallium arsenide having a surface barrier pn junction on one surface thereof. Advantageously, this surface may comprise a thin layer of semiconductor material produced by epitaxial deposition. On a limited portion of this epitaxial layer a thin film of gold is evaporated to make the surface barrier. Then, on top of this gold film a relatively thick button of silver is produced by evaporation deposition. During both evaporation depositions the temperature remains below the alloying temperature for the materials involved. For protection and ease of electrical connection, a thin plating of gold is deposited over the silver element. Low resistance contact to the bulk portion of the wafer is provided by plating and alloying a layer of tin to the back surface. A chemical etchant then is applied to remove the portions of the epitaxially deposited surface region not covered by the surface barrier gold contact element. Thus a diode element is produced having a limited area, very shallow, rectifying junction and having a very low resistance pure metal contact bonded thereto, to which connection can be easily made, typically, by resilient external conductors without severe alignment problems.

Figure 3:
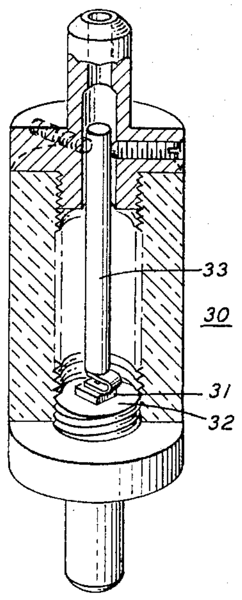
Figure 2:
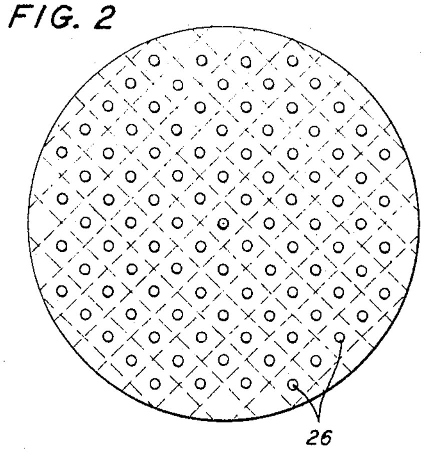

The invention and its other objects and features may be better understood from the following detailed description taken in connection with the drawing in which:

FIG. 1A through G illustrates the steps in producing a diode element in accordance with this invention;

FIG. 2 illustrates the multiple fabrication of these elements from a single slice of semiconductor material; and FIG. 3 is an example of one typical form of encapsulation for a diode element in accordance with this invention.

Referring to FIG. 1A of the drawing, there is represented in cross section a portion 11 of a slice of low resistivity n-type gallium arsenide single crystal semiconductor material. The drawing is not to scale and certain dimensions are exaggerated for clarity. Typically, the entire slice 20 is, as shown in FIG. 2, approximately one-half inch in diameter and about five to ten mils in thickness, a mil being one-thousandth of an inch. For ease of illustration, FIG. 1A through G shows in cross section a single element 11 of the many usually fabricated from the slice 20 shown in FIG. 2. FIG. 1A depicts a portion of the low resistivity n-type gallium arsenide slice which comprises the starting material. Using well-known techniques, a thin layer 22 of relatively high resistivity n-type gallium arsenide is deposited on one surface of this slice. As shown in FIG. 1B, the broken line 21 indicates the original surface of the slice and the layer 22 is the epitaxially deposited portion. Typically, the layer 22 has a thickness of 0.5 to 3.0 microns. Advantageously this layer has a final thickness just equal to the space charge layer at the desired reverse breakdown voltage.

Although not shown in the drawing, it is advantageous at this point in the process to apply the ohmic back contact which comprises a plating of tin accompanied by a shallow alloying operation. Turning again to the drawing, in FIG. 1C before application of the tin electrode, the slice 20 has been reduced in overall thickness from about .020 inch to about .008 inch by lapping and etching of the surface opposite to that having the epitaxial layer. One suitable etchant comprises a solution of hydrofluoric and nitric acid in water. Following application of the tin plating the epitaxial layer surface is very lightly etched to achieve optimum thickness. A desirably slow etch rate of three to four microns per minute may be achieved also using a sulfuric acid-hydrogen peroxide and water mixture and also a phosphoric acid-hydrogen peroxide and methyl alcohol mixture.

A metal mask having apertures of the desired diameter, typically .001 inch or .002 inch is placed in direct contact with the etched surface 23. The masked slice is mounted in a vacuum evaporation apparatus which is evacuated to about $5 \times 10^{-6}$ millimeters mercury. The mounting jig and slice then are heated to about 200 degrees centigrade and, using an induction heated molybdenum crucible, a thin film of from two to three microns of gold is deposited through the mask onto the surface 23 to produce the gold film 24 on a limited portion of the slice.

Following the gold operation, another crucible containing silver is inserted immediately into the induction heater to deposit a layer of from .0005 to .001 inch of silver. This produces the silver layer 25 on top of the gold film 24. Then in the same apparatus another two to three micron layer 26 of gold is deposited on top of the silver for corrosion protection and ease of contacting.

The slice 20 then is removed from the deposition apparatus and cut up into individual wafers each having a button contact centrally disposed thereon.

The wafer then is masked with a dot of wax over the button contact and its immediate perimeter, and the unit, mounted on a wafer stud, is etched in methyl alcohol saturated in bubbling chlorine. This etchant attacks the edges of the wafer preferentially and removes the outer edge portions of the wafer to minimize the possibility of contact between the C spring member and edges of the wafer.

Also as shown in FIG. 1F but after removal of the wax mask, a very brief, about two seconds, etch in a mixture of five parts nitric acid to one part hydrofluoric acid produces a slight undercutting to remove the portion of the epitaxial film surrounding the metal button.

Finally, as shown in FIG. 1G, contact is made to the button by means of the resilient spring member 30 mounted on a stud member 31 as shown partially. Finally, the assembly is housed in an encapsulation as shown in FIG. 3 of conventional configuration.

It is important to note that at no time is the temperature of the assembly raised to a level at which an alloying of the materials might occur. Thus the surface barrier gold film is deposited, in effect, at a cold temperature.

Similarly, the subsequent metal evaporations are at temperatures will below those at which alloying of gold and silver with gallium arsenide occur. Thus there is disclosed herein another form of advantageous varactor structure similar in certain respects to the arrangement disclosed in my original application referred to hereinbefore.

Varactor diodes constructed in accordance with the arrangement disclosed in this application have been incorporated in parametric amplifiers to produce the following advantageous results:

DYNAMIC QUALITY FACTOR $\tilde{Q}$ AT 5.85 Gc

| Diode No. | $C_{o(pf)}$ | $\tilde{Q}_{5.85}$ (+0.45 v.~−6.0 v.) | fc (estimated) |
|---|---|---|---|
| SH 11 C-2 | 0.562 | 16 | >350 Gc. |
| SH 11 C-3 | 0.677 | 14.5 | >310 Gc. |
| SH 11 C-4 | 0.300 | 4.8 | >110 Gc. |

Alternatively, the varactor in accordance with this invention may comprise a silver button contact deposited directly upon the epitaxial layer, omitting the gold. Such a device is capable of withstanding somewhat higher temperatures than one including the gold contact.

Although the invention has been disclosed in connection with this one particular embodiment, it will be understood that variations may be made by those skilled in the art which still are within the spirit and scope of the invention.

What is claimed is:

1. In the method of fabricating a high frequency gallium arsenide semiconductor diode the steps comprising depositing on one surface of a body of gallium arsenide of one conductivity type a thin film of epitaxially deposited gallium arsenide of said one conductivity type and of relatively higher resistivity, depositing on a limited portion of the surface of said epitaxial film a thin film of gold to form a surface barrier with said gallium arsenide, depositing on the surface of said gold film a button of silver having a thickness of from about one-half to one mil, depositing a thin layer of gold over said button, and applying an etchant to the surface of said body including said button to remove substantially all of said epitaxial film except for the portion covered by said button.

2. A high frequency capacitive semiconductor diode comprising a wafer of gallium arsenide semiconductor material having a rectifying surface barrier comprising a thin layer of gold of limited extent on said wafer surface, an element of silver in contact with said gold layer and coextensive therewith said silver element being in low resistance electrical contact with said rectifying surface barrier with substantially no penetration of said surface barrier, a second thin layer of gold overlying said silver element, and a conductive member in contact with said second thin overlayer of gold.

3. A high frequency capacitive semiconductor diode in accordance with claim 2 in which said rectifying surface barrier comprises a thin layer of gold having a thickness of from two to three microns and the adjoining gallium arsenide semiconductor material comprises a layer having a thickness of from one-half to three microns produced by epitaxial deposition on the gallium arsenide wafer and being of the same conductivity type as the gallium arsenide wafer.

4. A high frequency capacitive semiconductor diode in accordance with claim 3 in which said rectifying surface barrier contact has a diameter of from one to two mils and said silver element has a thickness of from one-half to one mil.

References Cited by the Examiner

UNITED STATES PATENTS

| | | | |
|---|---|---|---|
| 3,012,175 | 12/1961 | Jones et al. | 317—237 |
| 3,015,048 | 12/1961 | Noyce | 317—234 |
| 3,028,663 | 4/1962 | Iwersen et al. | 317—235 |
| 3,110,849 | 11/1963 | Soltys | 317—237 |
| 3,116,174 | 12/1963 | Grust et al. | 317—234 X |
| 3,154,450 | 10/1964 | Hoeckelman et al. | 156—17 |
| 3,160,539 | 12/1964 | Hall et al. | 156—17 |

JOHN W. HUCKERT, *Primary Examiner.*

R. F. POLISSACK, *Assistant Examiner.*